United States Patent
Long

(10) Patent No.: US 7,643,310 B2
(45) Date of Patent: Jan. 5, 2010

(54) SHIELDING DEVICE

(75) Inventor: Jiang Long, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 0 days.

(21) Appl. No.: 12/331,551

(22) Filed: Dec. 10, 2008

(65) Prior Publication Data

US 2009/0262511 A1    Oct. 22, 2009

(30) Foreign Application Priority Data

Apr. 22, 2008    (CN) .......................... 200810301249

(51) Int. Cl.
    *H05K 9/00*    (2006.01)
(52) U.S. Cl. .................. 361/816; 361/800; 361/818; 174/350; 174/377
(58) Field of Classification Search .................. 361/800, 361/816, 818, 753, 799; 174/350, 377
    See application file for complete search history.

(56) References Cited

U.S. PATENT DOCUMENTS

| | | | | |
|---|---|---|---|---|
| 5,095,177 A * | 3/1992 | Johnson | ....................... | 174/372 |
| 5,353,201 A * | 10/1994 | Maeda | ....................... | 361/816 |
| 5,495,399 A * | 2/1996 | Gore et al. | ....................... | 361/814 |
| 5,825,634 A * | 10/1998 | Moorehead, Jr. | ....................... | 361/816 |
| 6,178,097 B1 * | 1/2001 | Hauk, Jr. | ....................... | 361/816 |
| 6,181,573 B1 * | 1/2001 | Riet | ....................... | 361/816 |
| 6,377,472 B1 * | 4/2002 | Fan | ....................... | 361/800 |
| 6,711,032 B2 * | 3/2004 | Sommer | ....................... | 361/816 |
| 6,754,088 B2 * | 6/2004 | Takeda | ....................... | 361/818 |
| 6,787,695 B2 * | 9/2004 | Martin et al. | ....................... | 174/384 |
| 6,870,091 B2 * | 3/2005 | Seidler | ....................... | 174/382 |
| 6,872,880 B2 * | 3/2005 | King et al. | ....................... | 174/372 |
| 7,113,410 B2 * | 9/2006 | Pawlenko et al. | ....................... | 361/818 |
| 7,285,732 B2 * | 10/2007 | Vinokor et al. | ....................... | 174/382 |
| 7,345,248 B2 * | 3/2008 | Vinokor et al. | ....................... | 174/382 |
| 7,491,899 B2 * | 2/2009 | Zuehlsdorf et al. | ....................... | 174/372 |

* cited by examiner

*Primary Examiner*—Dameon E Levi
(74) *Attorney, Agent, or Firm*—Steven M. Reiss

(57) ABSTRACT

A shielding device (10) and method are provided. The shielding device (10) includes a frame (21) and an enclosure (22). The enclosure (22) includes a cover portion (221) and a first peripheral wall (222) connecting to the cover portion (221). The frame (21) includes a second peripheral wall (21) and a plurality of guiding sheets (215) connected to the second peripheral wall (211). The first peripheral wall (222) is detachably received in the frame (21). A gap (23) is formed between the first peripheral wall (222) and the guiding sheets (215), used to detach the enclosure (22) from the frame (21).

2 Claims, 5 Drawing Sheets

SHIELDING DEVICE

BACKGROUND

1. Technical Field

The present disclosure relates to shielding devices and, particularly, to a detachable shielding device.

2. Description of Related Art

Shielding devices are usually used in electronic devices to shield internal electronic components from electromagnetic interference (EMI).

FIGS. 4 and 5 show a typical shielding device 10 including a frame 12 secured on a printed circuit board 11 and a shielding enclosure 13. Two latching domes 121 protrude from a peripheral wall of the frame 12. The shielding enclosure 13 includes a cover portion 131 having a peripheral wall 132. The peripheral wall 132 defines holes 133 to latch the latching domes 121. Gaps 134 are defined through the peripheral wall 132 adjacent to the holes 133. To remove the latched enclosure 13 from the frame 12, a tool may be inserted into the gaps 134 to separate the peripheral wall 132 from the outer peripheral wall of the frame 12 and disengage the latching domes 121 out of the holes 133.

However, the electronic components on the printed circuit board 10 are arranged closely to each other and the gaps 134 are usually small. Thus, it is difficult to properly insert the tool into the gap 134.

Therefore, there is room for improvement within the art.

BRIEF DESCRIPTION OF THE DRAWINGS

Many aspects of the shielding device can be better understood with reference to the following drawings. These drawings are not necessarily drawn to scale, the emphasis instead being placed upon clearly illustrating the principles of the present shielding device. Moreover, in the drawings like reference numerals designate corresponding sections throughout the several views.

DETAILED DESCRIPTION OF EXEMPLARY EMBODIMENT

Figure 1:
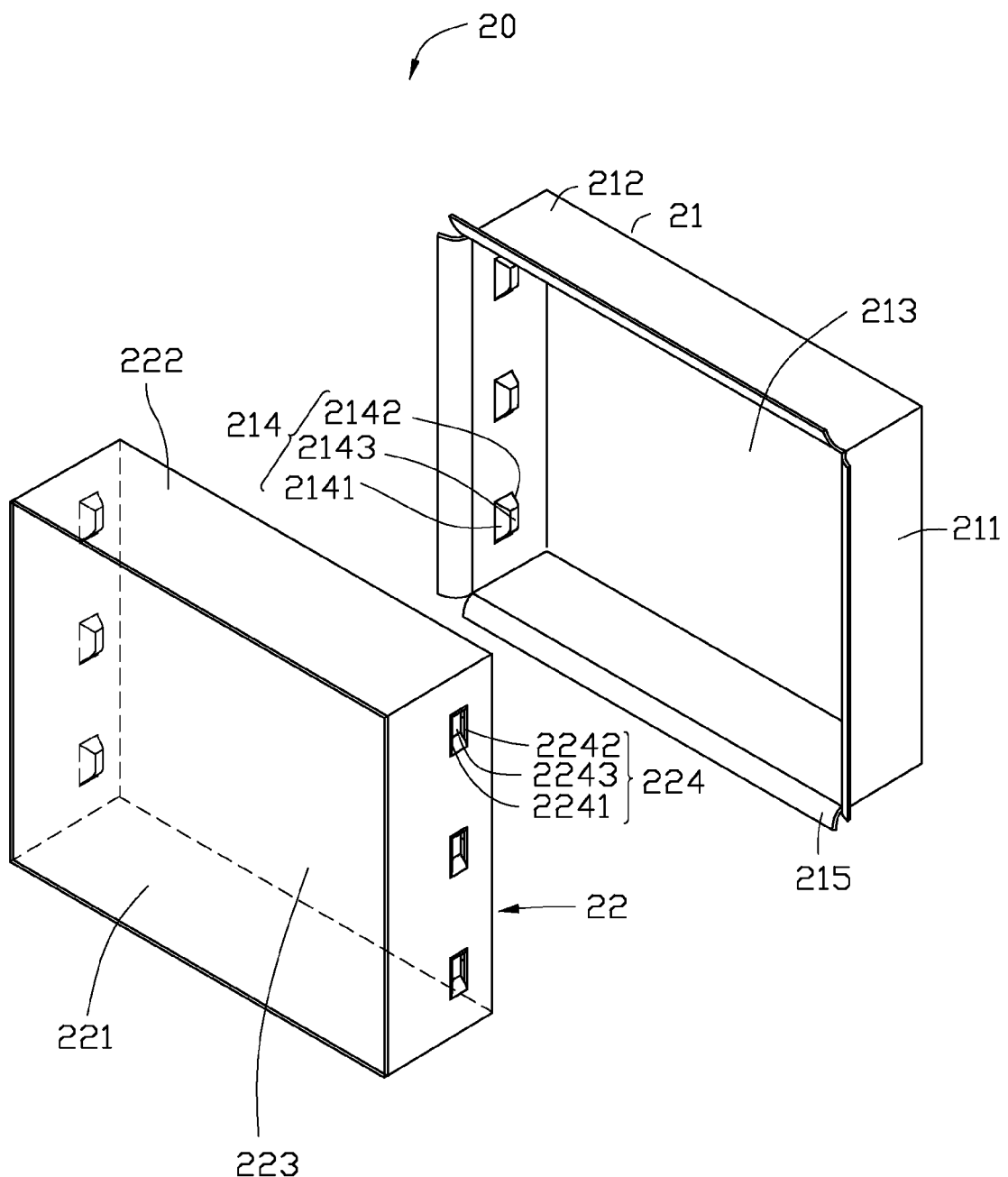
FIG. 1 is an exploded, isometric view of a shielding device, in accordance with an exemplary embodiment.
Figure 2:
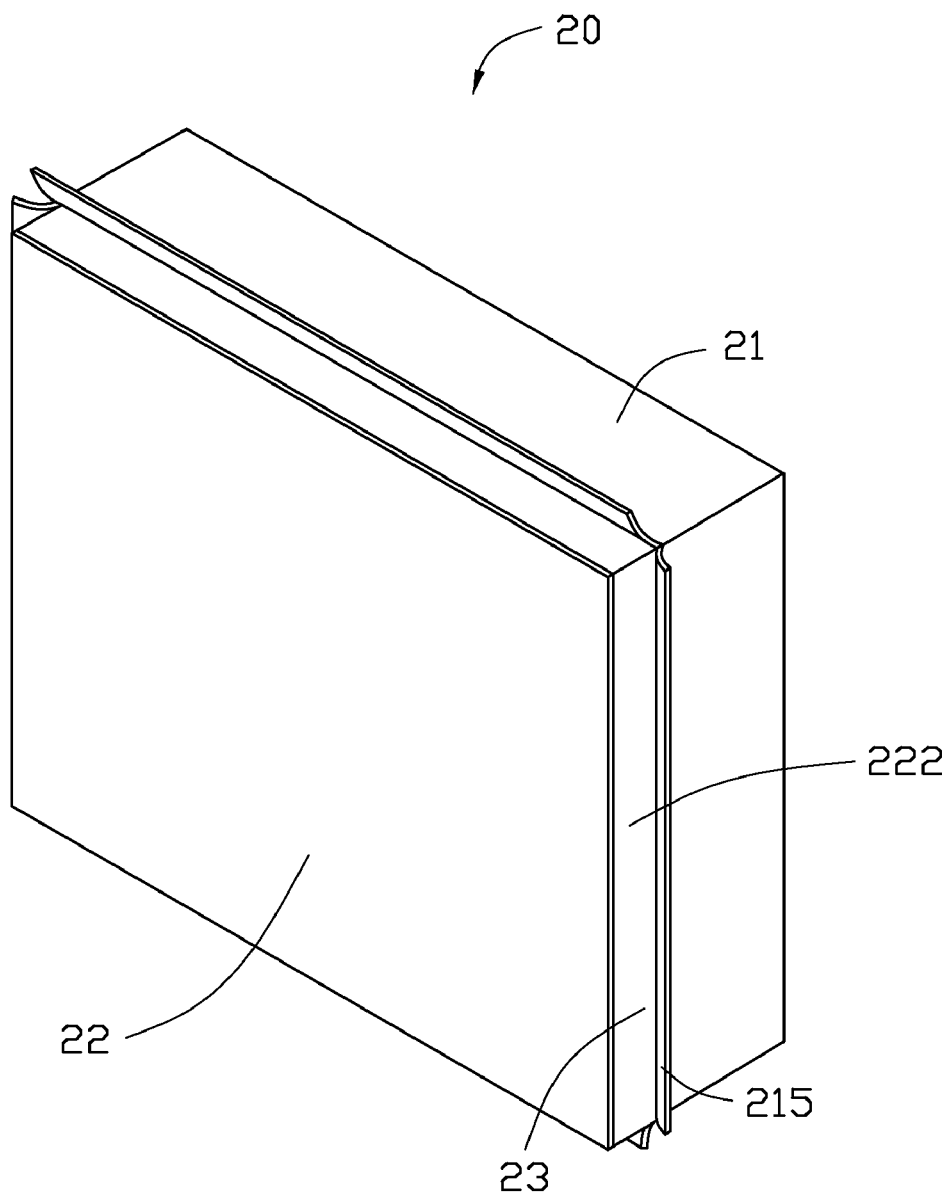
FIG. 2 is an isometric, assembled view of the shielding device shown in FIG. 3.

FIGS. 1 and 2 show an exemplary shielding device 20 including a hollow frame 21 and an enclosure 22. The enclosure 22 can be partially secured in the frame 21.

The frame 21 can be metallic and fixed (e.g., welded) to a printed circuit board (PCB) to surround electronic components on the PCB. The frame 21 includes two first walls 211 and two second walls 212. The first walls 211 and the second walls 212 enclose a receiving space 213 to receive the surrounded electronic components. A plurality, e.g. three, latch blocks 214 may protrude from one or both of the first walls 211. Each latch block 214 includes a first guiding surface 2141, a first abutting surface 2142 and a first connecting surface 2143. The first guiding surface 2141 and the first abutting surface 2142 connect to the first connecting surface 2143 at an obtuse angle, respectively. Each of the first walls 211 and the second walls 212 has a guiding sheet 215 on the edge. The guiding sheets 215 extend outwardly from the receiving space 213.

The enclosure 22 is metallic, including a cover portion 221 and a peripheral wall 222. The peripheral wall 222 is perpendicular to the cover portion 221 and encloses an accommodating space 223. The peripheral wall 222 defines one or more latch slots 224 corresponding to the latch blocks 214. Each latch slot 224 is defined by a second guiding surface 2241, a second abutting surface 2242 and a second connecting surface 2243. The second guiding surface 2241 and the second abutting surface 2242 each connect to the second connecting surface 2243 at an obtuse angle. The second abutting surface 2242 abuts against the first abutting surface 2142.

Figure 3:
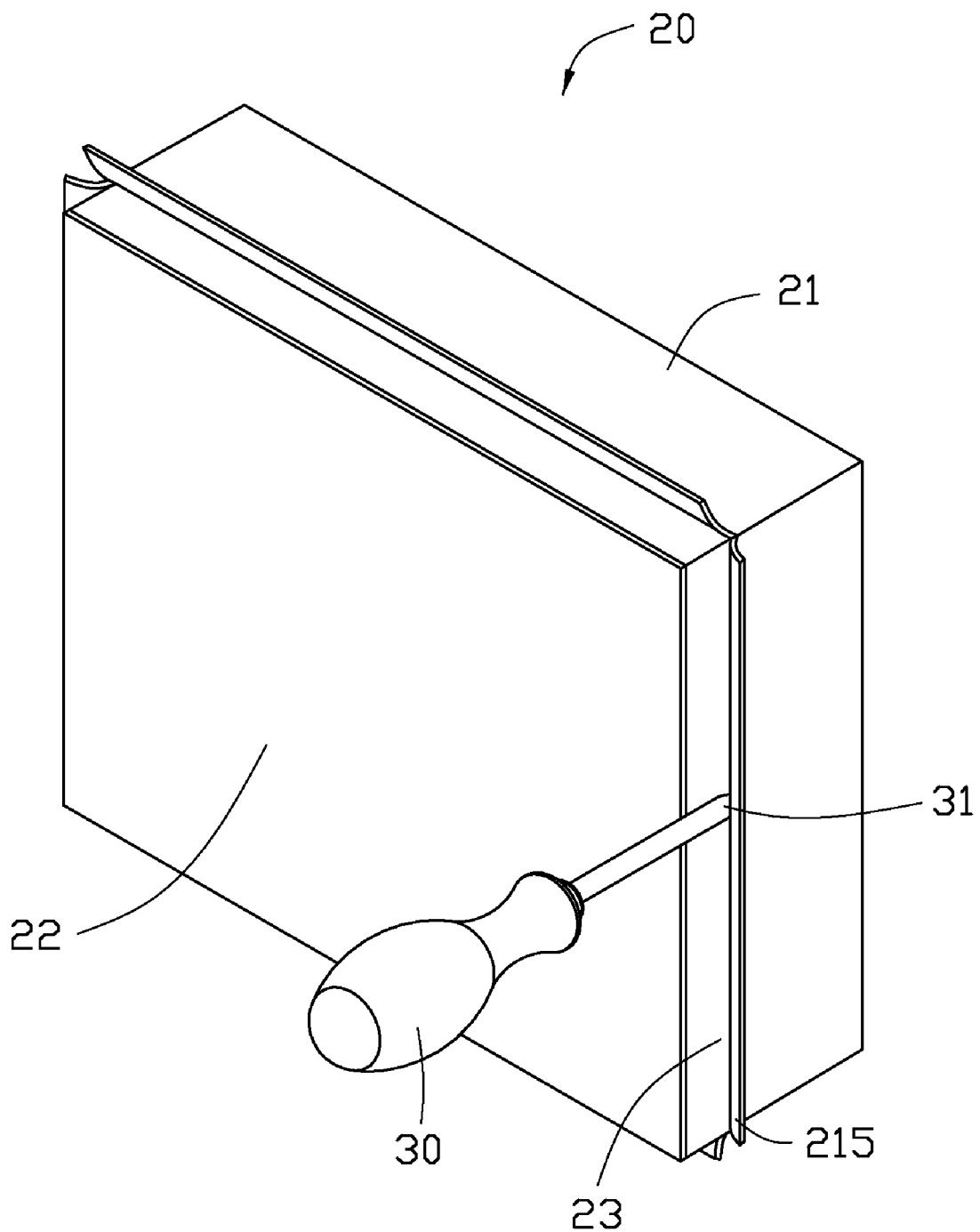
FIG. 3 is a view showing the disassembly of the shielding device shown in FIG. 3.
Figure 4:
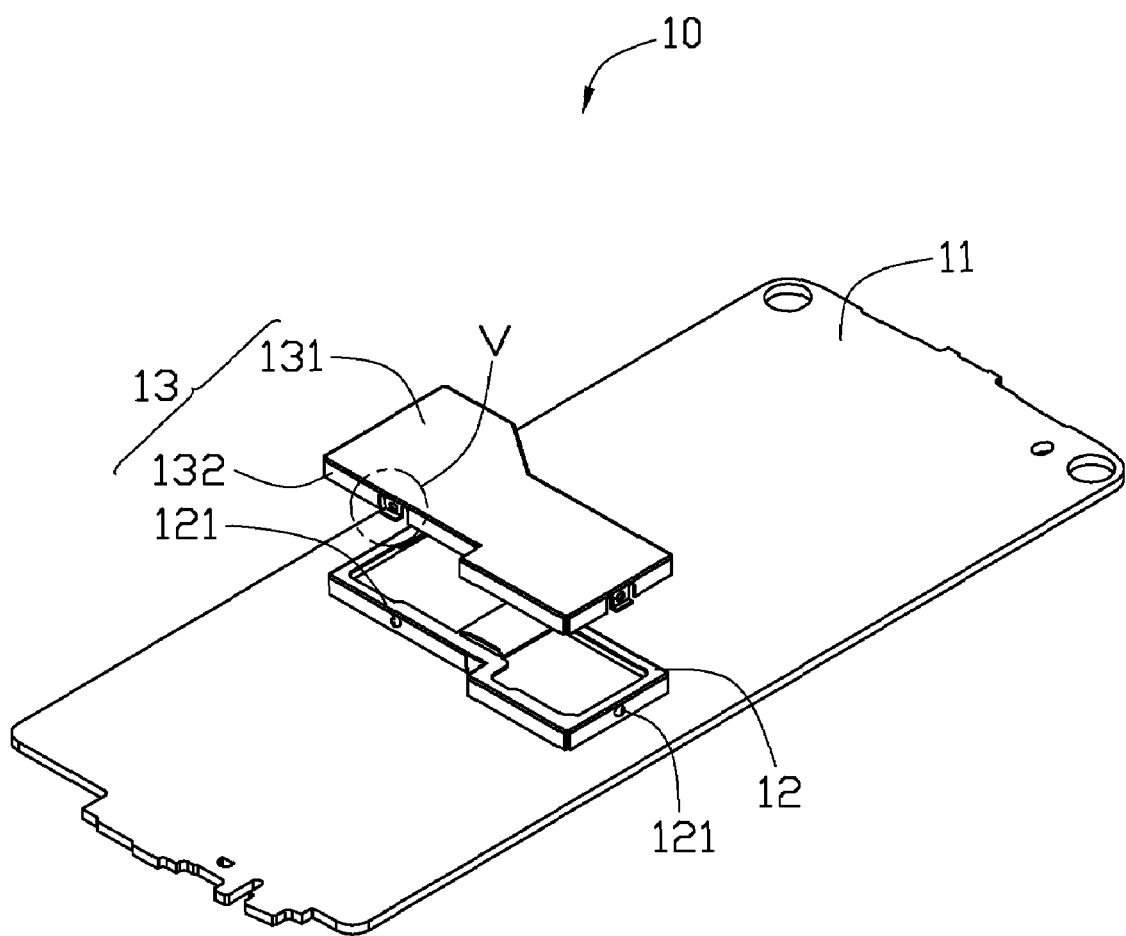
FIG. 4 is an exploded, isometric view of a conventional shielding device.
Figure 5:
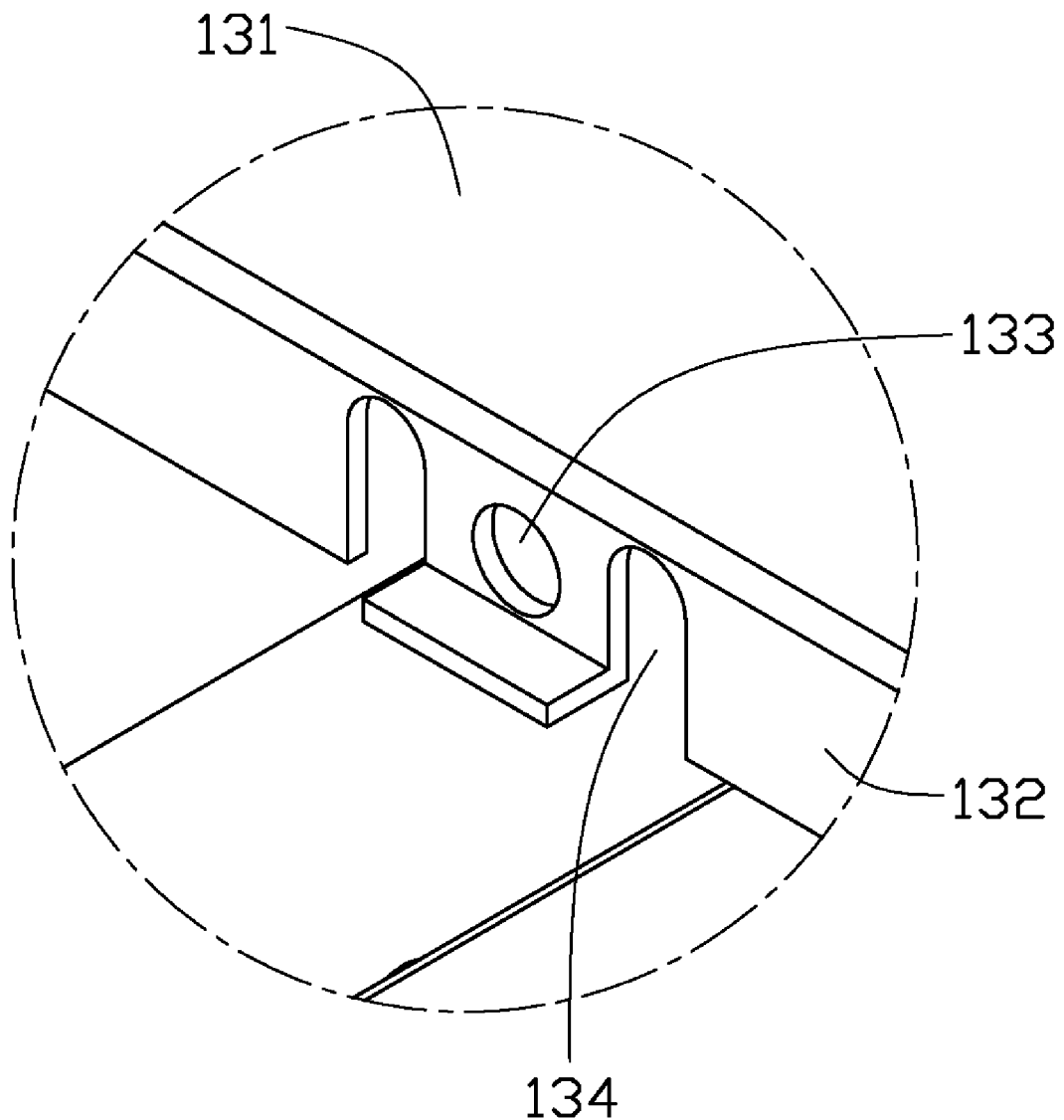
FIG. 5 is a partially enlarged view of the shielding device shown in FIG. 4.

Referring to FIG. 3, the enclosure 22 can be latched to the frame 21. During this stage, the guiding sheets 215 direct the peripheral wall 222 into the receiving space 213 until the latch blocks 214 interlock with the latch slots 224. A gap 23 is defined between the first peripheral wall 211 and the second peripheral wall 222.

To release the latching of the enclosure 22 and the frame 21, a tool 30 with a sharp end 31 is guided into the gap 23 between the first peripheral wall 211 and the second peripheral wall 212 by the guiding sheets 215. By using the tool 30 to deflect the peripheral wall 222 inwardly, the tool 30 can easily release the latch blocks 214 from the latch slots 224. Thus, the enclosure 22 can be easily separated from the frame 21.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of sections within the principles of the invention to the full extent indicated by the broad general meaning of the terms, in which the appended claims are expressed.

What is claimed is:

1. A shielding device, comprising:
   an enclosure including a cover portion and a first peripheral wall connected to the cover portion; and
   a hollow frame including a second peripheral wall that is substantially parallel to the first peripheral wall and having a plurality of guiding sheets, the guiding sheets extending angularly from the second peripheral wall and forming the outermost edges of the hollow frame, the first peripheral wall being detachably received in the frame, and tightly connected to the second peripheral wall, with a gap being formed between the first peripheral wall and the angled guiding sheets second peripheral wall, the gap and the guiding sheets being used to direct a tool between the first peripheral wall and the second peripheral wall to detach the enclosure from the frame,
   wherein the second peripheral wall encloses a receiving space, a plurality of latch blocks protrude from the second peripheral wall towards the receiving space, the first peripheral wall defines a plurality of latch slots, the latch blocks engage with the latch slots, respectively,
   wherein each latch block includes a first guiding surface, a first abutting surface and a first connecting surface, the first guiding surface and the first abutting surface connect to the first connecting surface at an obtuse angle, respectively.

2. The shielding device as claimed in claim 1, wherein each latch slot includes a second guiding surface, a second abutting surface and a second connecting surface, the second abutting surface and the second guiding surface connect to the second connecting surface at an obtuse angle, respectively, the first and second abutting surfaces abutting against each other.

* * * * *